(12) United States Patent
Chechik et al.

(10) Patent No.: US 6,284,114 B1
(45) Date of Patent: Sep. 4, 2001

(54) METHOD OF FABRICATING A POROUS POLYMERIC MATERIAL BY ELECTROPHORETIC DEPOSITION

(75) Inventors: Nina G. Chechik; Richard M. Levering, Jr., both of Hockessin; David B. James, Newark, all of DE (US); Lee Melbourne Cook, Steelville, PA (US)

(73) Assignee: Rodel Holdings Inc., Wilmington, DE (US)

( * ) Notice: Subject to any disclaimer, the term of this patent is extended or adjusted under 35 U.S.C. 154(b) by 0 days.

(21) Appl. No.: 09/536,189

(22) Filed: Mar. 24, 2000

Related U.S. Application Data

(63) Continuation-in-part of application No. 09/162,595, filed on Sep. 29, 1998, now abandoned.
(60) Provisional application No. 60/060,294, filed on Sep. 29, 1997, and provisional application No. 60/060,295, filed on Sep. 29, 1997.

(51) Int. Cl.[7] .............................. C23C 28/00; C23F 17/00
(52) U.S. Cl. ......................... 204/483; 204/492; 204/499
(58) Field of Search .................................. 204/471, 490, 204/492, 496, 499, 483

(56) References Cited

U.S. PATENT DOCUMENTS

| | | |
|---|---|---|
| 3,284,274 | 11/1966 | Hulslander et al. . |
| 3,504,457 | 4/1970 | Jacobsen et al. . |
| 3,928,156 | 12/1975 | Wismer et al. . |
| 4,554,061 | 11/1985 | Ritchie . |
| 4,841,680 | 6/1989 | Hoffstein et al. . |
| 4,954,141 * | 9/1990 | Takiyama et al. ................. 51/296 |
| 5,492,614 | 2/1996 | Zawacky et al. . |

OTHER PUBLICATIONS

"Development of Highly Homogeneous Pellets Applying Electrophoretic Deposition of Ultrafine Abrasives for Nanometer Grinding", Junichi Ikeno, Yashuhiro Tani, Hisayosi Sato, Annals of the CIRP Vol. 43.1.1994, pp 319–322. No month avail.

* cited by examiner

*Primary Examiner*—Kathryn Gorgos
*Assistant Examiner*—Wesley A. Nicolas
(74) *Attorney, Agent, or Firm*—Gerald K. Kita; Kenneth A. Benson; Konrad Kaeding

(57) ABSTRACT

A method is provided for the fabrication of a porous polymeric material by electrophoretic deposition. The porous polymeric material is particularly well suited as a polishing surface for the planarization of semiconductor wafers.

15 Claims, 3 Drawing Sheets

METHOD OF FABRICATING A POROUS POLYMERIC MATERIAL BY ELECTROPHORETIC DEPOSITION

This application is a Continuation-in-part of U.S. application Ser. No. 09/162,595 filed Sep. 29, 1998, now abandoned, which claims the benefit of U.S. Provisional Applications Nos. 60/060,294 and 60/060,295 filed Sep. 29, 1997.

BACKGROUND OF INVENTION

1. Field of the Invention

The present invention generally relates to porous polymeric materials, particularly useful for polishing in the semiconductor industry. More particularly, materials of the present invention are formed by an electrophoretic deposition technique. (As used in this application the term "polishing", or any form thereof, is intended to include planarizing and any corresponding form.)

2. Discussion of Related Art

The requirements of extremely high circuit density in semiconductor devices have created the need for high precision surfaces. The need for these ultra smooth and planar surfaces requires extremely uniform and homogeneous polishing pads. Accurate delineation of semiconductor manufacturing processes requires little or no variation from pad to pad.

Traditionally, polishing has been accomplished by introducing an abrasive polishing fluid (slurry) between a polishing pad and a workpiece to be polished and creating relative motion between them. A widely used material for polishing pads is taken from a class of materials known as poromerics. Poromerics are textile-like materials that usually contain a urethane-based impregnation or coating having a multitude of pores or cells. The porosity facilitates the flow and distribution of the slurry.

Many poromeric materials used for polishing are similar to the material described in U.S. Pat. No. 3,284,274. These polishing poromerics are somewhat different from most other poromerics in that the surface of polishing poromerics contains large macropores or cells. It is believed that these large macropores or cells act to hold slurry and thus aid the polishing process. U.S. Pat. No. 3,504,457 describes the use of these materials in polishing silicon semiconductor substrates.

One prior art method for manufacturing poromeric polishing materials is to coat a solution of polymer onto a substrate and then immerse the coated substrate into a bath that will cause coagulation of the polymer. Once the polymer has been sufficiently coagulated, the remaining solvent is leached out and the product is dried. The next step in the manufacturing process is to remove the top skin by passing the material under a blade or under a rotating abrasive cylinder. Once the top skin is removed the underlying pores are exposed and open to the surface.

An important characteristic of this prior art product is the configuration of its cell structure. Because of the nature of the coagulation process, the pores and cells tend to increase in diameter as they penetrate deeper into the material. This means that the diameters of the cells exposed on the working surface of the material are relatively small compared to the underlying cell diameters. This can be readily seen on FIG. 3, which is a photomicrograph of a cross section of a Politex® (polishing pad manufactured by Rodel, Inc., Newark, Del.

In the polishing process there are disadvantages to the small surface opening of the pores. First, slurry can build up in the pores more readily than if the pore had larger surface diameters. The trapped slurry reduces the pad's polishing ability. Second, small pore openings translate to more pad surface area contacting the workpiece. For traditional polishing, this decreases the presentation of new slurry to the workpiece.

U.S. Pat. No. 4,841,680 describes a poromeric polishing pad having a working surface comprised of a microporous polymeric material which contains open cells that have their largest opening at the work surface and are deep enough to carry a relatively large quantity of slurry. The pad is made by conventional solvent/nonsolvent polymer coagulation technology. However, instead of removing the top skin, a second substrate is affixed to the top of the poromeric layer, and the first substrate is removed from the bottom to expose the pores at their largest diameter.

These prior art poromeric material manufacturing techniques introduce variation into the pad fabrication process at a number of steps. With the need for well defined semiconductor device manufacturing parameters, highly reproducible polishing results are extremely important. Therefore a need exists for a more uniform and homogeneous porous polymeric material suitable for polishing pads and other applications.

Electrophoretic deposition has been used to manufacture nonporous grinding materials. The process, such as that described in the article Development of Highly Homogeneous Pellets Applying Electrophoretic Deposition of Ultrafine Abrasives for Nanometer Grinding by Jinuichi Ikeno, Yasuhiro Tani and Hisayosi Sato (Annals of the CIRP Vol. 43/1/1994, pp 319–322), consists of mixing colloidal silica with polyvinyl alcohol solution, forming a deposition layer from the mixture using electrophoretic deposition, fabricating pellets by cutting the layer, and then drying the pellets.

SUMMARY OF THE INVENTION

The present invention is directed to a porous polymeric material useful as a polishing pad material fabricated by an electrophoretic deposition technique. The material may be formed with or without abrasives. By careful regulation of the voltage, current and/or pH levels and their rates of change, a desired pore structure can be obtained.

An aspect of the invention is a method for producing a porous polymeric polishing pad material having uniformly distributed and shaped pores by electrophoretic deposition comprising
  a. immersing a substrate electrode in a coating bath comprising particles of a polymer,
  b. immersing a second electrode in the coating bath;
  c. mixing the coating bath continuously;
  d. passing a direct electric current between the substrate electrode and the second electrode at a constant level thereby creating an initial potential;
  e. varying the electrical conditions thereby creating a uniform porous polymer coating on the substrate,
  f. removing the substrate and coating from the coating bath,
  g. drying the coating,
wherein the resulting pad material has a porosity of 20% to 80%.

Another aspect of the invention is a polymeric polishing pad material produced by electrophoretic deposition having uniformly distributed and shaped pores produced by:

a. immersing a substrate electrode in a coating bath comprising particles of a polymer;
b. immersing a second electrode in the coating bath;
c. mixing the coating bath continuously;
d. passing a direct electric current between the substrate electrode and the second electrode at a constant level thereby creating an initial potential;
e. varying the electrical conditions thereby creating a porous polymer coating on the substrate.
f. removing the substrate and coating from the coating bath,
g. drying the coating, wherein the resulting pad material has a porosity of 20% to 80%.

A further aspect of the invention is a method of polishing comprising of the steps of
a. bringing a workpiece into close proximity to a polishing pad;
b. introducing a polishing fluid between the pad and the workpiece;
c. moving the workpiece and pad in relative motion to one another to effect polishing;

wherein the pad has uniformly distributed and shaped pores and is produced by an electrophoretic deposition method comprising the steps of
a. immersing a substrate electrode in a coating bath comprising particles of a polymer,
b. immersing a second electrode in the coating bath;
c. mixing the coating bath continuously;
d. passing a direct electric current between the substrate electrode and the second electrode at a constant level thereby creating an initial potential;
e. varying the electrical conditions thereby creating a porous polymer coating on the substrate.
f. removing the substrate and coating from the coating bath,
g. drying the coating, wherein the resulting pad material has a porosity of 20% to 80%.

Preferred polishing pad materials fabricated by this technique have a thickness (T) of 10 to 1000 mils wherein the pores have a length to diameter ratio (l/d) of 1:1 to 5:1. Preferred size of pores in relation to the material thickness is wherein length of pore (l) divided by thickness (T) is 0.2 to 0.95. The material has a uniform porosity wherein the pores make up 20% to 80% of the polishing pad material. The longest dimension of a pore is generally oriented perpendicular to the coating substrate.

BRIEF DESCRIPTION OF THE DRAWINGS

FIG. 2 is a schematic side view of a polishing system in which a porous polishing pad of the present invention may be used to planarize a substrate for use in the manufacture of a semiconductor device or the like.

DESCRIPTION OF THE INVENTION

Figure 1:
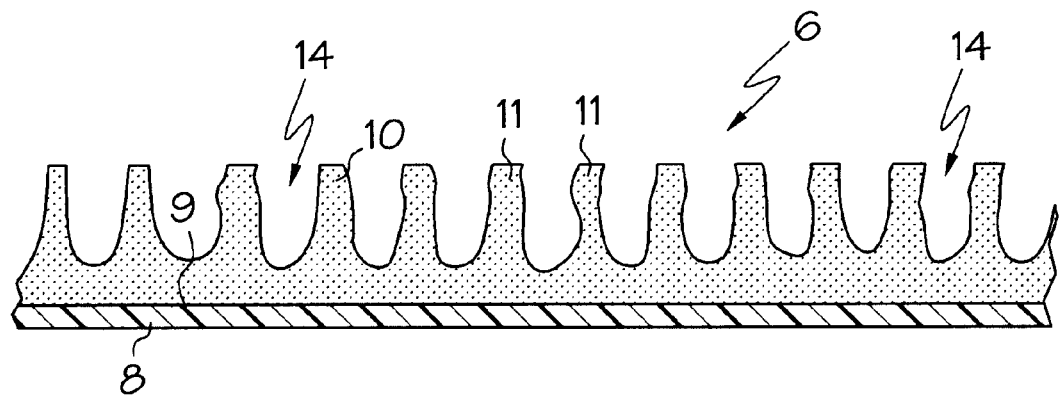
FIG. 1 is an enlarged cross sectional schematic view of a portion of a porous polishing pad made by the process of this invention.

The porous polymeric materials of the present invention are produced by an electrophoretic deposition technique. The technique produces surprisingly uniform and homogeneous materials. The homogeneity and uniformity make these materials particularly well suited for polishing applications in the semiconductor industry. Furthermore, the methods of the present invention may be used to produce porous films for a wide variety of applications.

The technique has been found to be uniquely versatile. Both abrasive and non-abrasive containing polishing pads can be produced by the methods of the present invention. A wide range of thicknesses is also possible. Preferred thicknesses are in the range of 5 to 1000 mils. More preferred is a thickness range of 10 to 500 mils. Most preferred is a thickness range of 10 to 200 mils.

Electrophoretic deposition techniques have previously been used to produce polymer films. A problem often encountered during fabrication of these films, is the presence of bubbles in the film. These bubbles are voids generally containing hydrogen or oxygen. Techniques have been developed specifically to reduce the presence of such bubbles. The present invention is unique in that, instead of eliminating the bubbles, it controls their presence and uses their existence to an advantage. The advantage is the production of a uniform, homogeneous, porous material. This ability to advantageously control the formation of bubbles thereby creating a porous structure has not been before recognized.

To form the porous polymer according to the present invention, polymer particles are suspended in a coating bath. The bath may be any solvent from which the polymer may be electrophoretically deposited. For example, solvents such as acetone, methyl-ethyl-ketone, N-methyl pyrrolidone, or a combination of solvents may be used. The coating bath preferably comprises water. The polymer concentration in the bath is preferably between 10% and 90%, more preferably between 20% and 60% and most preferably between 30% and 50%. The optimum solids concentration and coating bath pH are dependent on the polymer, coating bath solvent and substrate used. In one embodiment the solids concentration and/or the pH are continually monitored without interruption to the process. A substrate is immersed in the coating bath and a direct electric current is passed between the substrate as a first electrode and a second electrode. The second electrode may be held at either a positive or negative potential with respect to the substrate. The necessary characteristics of the substrate include sufficient conductivity; ability to form a strong bond with the polymer, and sufficient roughness. The substrate may be, but is not limited to, metals (such as bronze and stainless steel), conductive polymers, and laminates. Substrates can also be non-rigid materials such as electrically conductive felt. Polymer particles may be either negatively charged or positively charged thereby being deposited on an anodic or cathodic substrate respectively. The polymer particles are drawn to the electrode substrate and deposited thereon. Once a coating thickness of between 1 mil (25.4μ) and 1000 mils (2.54 cm) has been achieved, the substrate is removed from the bath. The coated substrate may be rinsed in deionized water and oven dried.

According to the present invention, pores are introduced into the material and their structure controlled by voltage, current and/or coating bath pH adjustments. The bubble density, size and shape may be regulated by these variations in electrical conditions. For instance, as voltage increases, the number of bubbles decreases but their size increases. As their size increases, they tend to open. For many polymers, slowly decreasing the voltage gives rise to long vertical pores.

The pore structure for pad material used in the chemical-mechanical polishing of semiconductor wafers can be very important to the polishing process. The porosity of the material controls the compressibility of the pad material. The open pores on the surface of the pad material provide a microtexture on the pad surface which enhances polishing. The pores also are good repositories for slurry and for debris from the polishing process.

The potential between the electrodes may be varied as deposition occurs. In one embodiment the potential is increased as deposition occurs. In an alternative embodiment, the potential is decreased. Voltage must be kept below the point at which degradation of the coating uniformity occurs.

It has also been found that pore structure can be controlled by varying the current instead of the voltage. In one embodiment the current is decreased as deposition occurs, thereby forming a porous structure. Another possible embodiment exists wherein the voltage is kept constant and the current is increased as deposition occurs.

Regulation of the coating bath pH may also be used to further control the porous structure. The pH may be increased by adding a base to the coating bath. Ammonium hydroxide and potassium hydroxide are examples of some of the bases that can be used. Alternatively, an acid may be added to the coating bath to decrease the pH. The pH may be gradually changed during the formation of the material to produce a porous structure.

The optimum initial current, voltage or pH levels and the rates of change, depend on the coating bath solvent, polymer, substrate, abrasives, substrate surface dimensions and deposition layer thickness. It should be noted that any combination of changes in current, voltage and pH may be used to control or adjust the pore structure.

Polymers may be chosen from a group of polymers including, but not limited to, polycarbonates, nylon, acrylonitrile-butadiene-styrene polymers, polyvinyl alcohol, polyacrylates, polyurethanes, urethane-acrylics, homo- and copolymers of acrylates or methacrylates.

In one embodiment of the present invention a polymer is combined with an aqueous dispersion of abrasive particles. Abrasives may include, but are not limited to, silica, alumina, silicon carbide, chromia, alumina-zirconia, iron oxide, ceria, boron nitride, boron carbide, garnet, zirconia and titania. According to the present invention the porous material may be made using any one type of abrasive or a combination of types.

During electrophoretic deposition, the abrasive particles are codeposited with the polymer onto the substrate to produce an abrasive-containing material. The weight ratio of abrasive particles to polymer particles may be between 1:9 and 9:1, preferably between 3:7 and 7:3 and most preferably between 4:6 and 6:4. An advantage of this method is that the abrasive particles are uniformly deposited throughout the polymeric matrix, with minimum agglomeration of the abrasive particles. This retention of primary sub-micron particle size is important to minimize defects in and scratching of a workpiece such as a semiconductor wafer.

For both abrasive and nonabrasive coatings it is important to maintain a steady concentration of solids in the coating bath. The solids must also stay uniformly dispersed in the bath. Furthermore, the coating bath pH must be kept uniform. These process requirements necessitate continuous mixing. Mixing may be accomplished by high shear mxing or other similar means.

Abrasive polishing materials produced by methods of the present invention are of particular importance because of the need they satisfy in the semiconductor industry. Abrasive materials produced by electrophoretic deposition are characterized by nano-asperities. Nanoasperities are defined as protrusions having a diameter of $0.01–0.50\mu$. They are of importance in chemical-mechanical polishing (CMP) of semiconductor device layers, a polishing method that produces the smoothness and planarity necessary for the fabrication of semiconductor devices, particularly those with a high component density. CMP may be accomplished by use of a particle-containing polishing fluid in conjunction with a non-particle-containing pad, by use of a particle-containing polishing pad, or a combination thereof In CMP the pad nanoasperities contact a workpiece surface. At the points of contact, the nanoasperities work in combination with a reactive polishing fluid to effect polishing activity. Nanoasperities may also work by breaking off from the pad. Use of an abrasive polishing pad may reduce or may even eliminate the need for abrasives in the polishing fluid.

Referring now to the drawings, FIG. 1 is an enlarged sectional view showing a polishing pad in accordance with the present invention. The pad 6 comprises backing or support layer 8 having front surface 9. Porous material 10 is bonded on front surface 9 of backing 8. The backing may be a polymer film, a fibrous web, a metal sheet, or anything which will give the porous material support. The porous material might be placed directly on the surface of a platen in a polishing machine. Porous material 10 may comprise plurality of abrasive particles 11. There are recesses or valleys 14 formed by the open pores on the surface of the porous polishing pad material. As shown in the figure, the longest pore dimension is generally oriented perpendicular to the backing and, therefore, the pores were formed in the electrophoretically coated layer generally oriented perpendicular to the substrate electrode.

Figure 2:
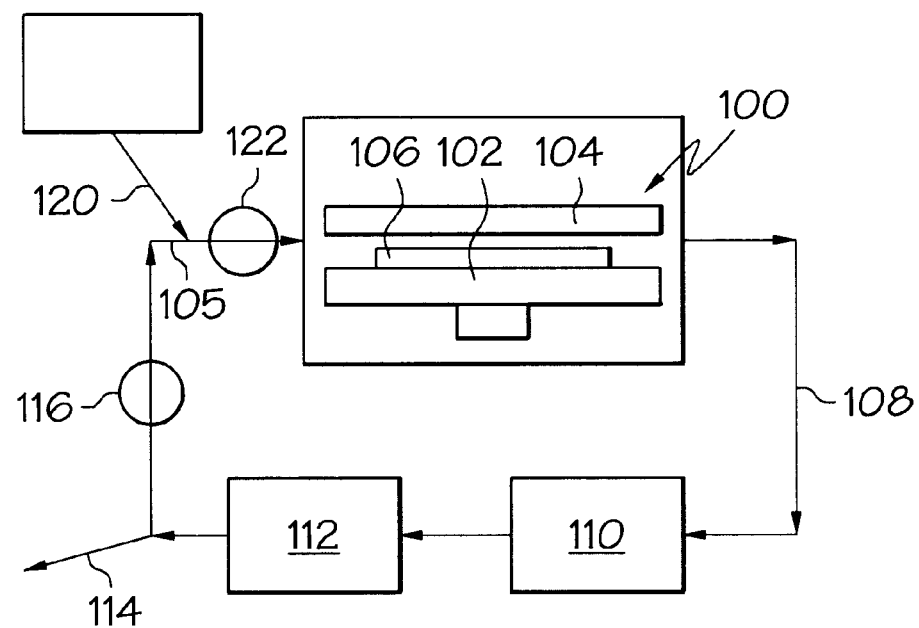
Figure 3:
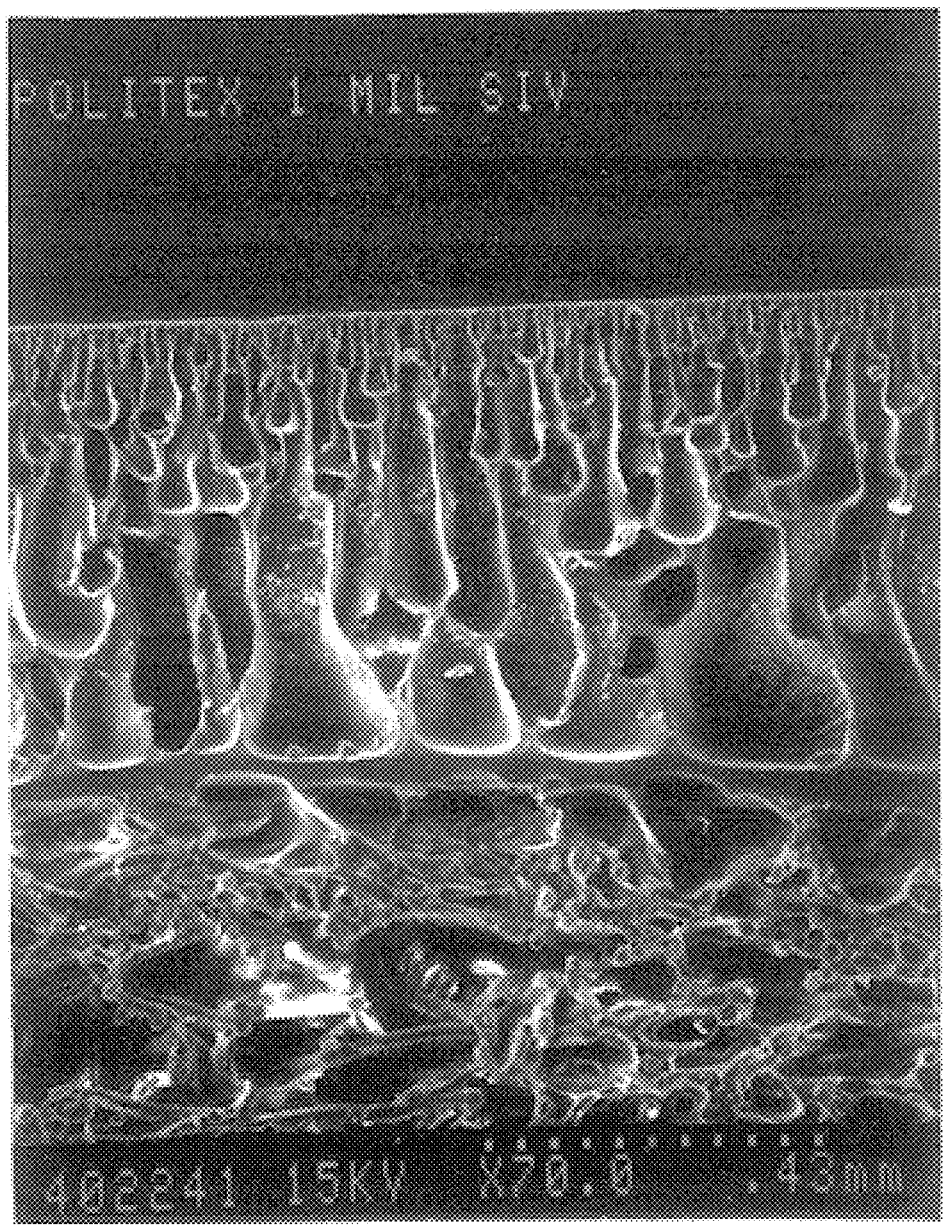
FIG. 3 is a photomicrograph of a cross section of a prior art Politex® polishing pad.

FIG. 2 provides a schematic representation of a polishing process in which polishing surfaces of the present invention might be used. The polishing apparatus is shown generally as 100, comprising a table 102, workpiece 106 and polishing pad 104. Polishing fluid is pumped into the polishing interface (between the pad and workpiece) by influent line 105. Used polishing fluid exits the polishing apparatus via effluent line 108. The polishing surfaces might be used in a polishing process without slurry recycling, however, they are particularly well suited for use with slurry recycle as described below.

The used polishing fluid may be filtered by filter 110, and deionized by ion exchange column 112. Excess polishing fluid can be removed by waste line 114. Sensor 116 may monitor the pH or other chemical properties of the recycled fluid, and inlet line 120 may provide appropriate additives to the recycled fluid, thereby rejuvenating it for another polishing cycle. Sensor 122 monitors the polishing fluid entering the polishing operation to ensure proper pH or other properties which are desired to be monitored for quality control.

The present invention includes a method for polishing wherein a polishing pad formed by an electrophoretic deposition technique described herein is used. A workpiece to be polished is brought into close proximity to the pad. A polishing fluid is introduced between the pad and the workpiece before and/or during the polishing process. The workpiece and pad are made to move relative to one another to effect polishing.

EXAMPLE 1

A uniform structure with large open pores was obtained by the following procedure. An apparatus was used comprising a polypropylene coating bath vessel, a magnetic stirrer, two stainless steel electrodes and an E-C Apparatus, Corp. power supply (model EC570). A coating bath was formulated comprising Witcobond W-506 (manufactured by Witco Corporation), a 40% solids colloidal waterborne polyurethane dispersion, and Ludox AS-40 (manufactured by duPont Company), a colloidal silica stabilized with NH40H and water. The ratio of Witcobond W-506 to Ludox AS-40 was 50:50 by solids. One liter of coating bath was mixed directly in the coating bath vessel. One stainless steel electrode was the substrate and was connected to the positive electrode of the power supply. The second stainless steel electrode was connected to the negative electrode of the power supply. The current was maintained at 25 mA. A potential of 7V was applied between the electrodes. The potential was increased as follows:

| Time (min) | Voltage (V) |
|---|---|
| 0 | 7 |
| 3 | 20 |
| 8 | 49 |
| 10 | 62 |
| 12 | 74 |
| 15 | 91 |
| 18 | 104 |
| 20 | 112 |
| 25 | 136 |
| 29 | 167 |
| 31 | 225 |
| 33 | 316 |

Figure 4:
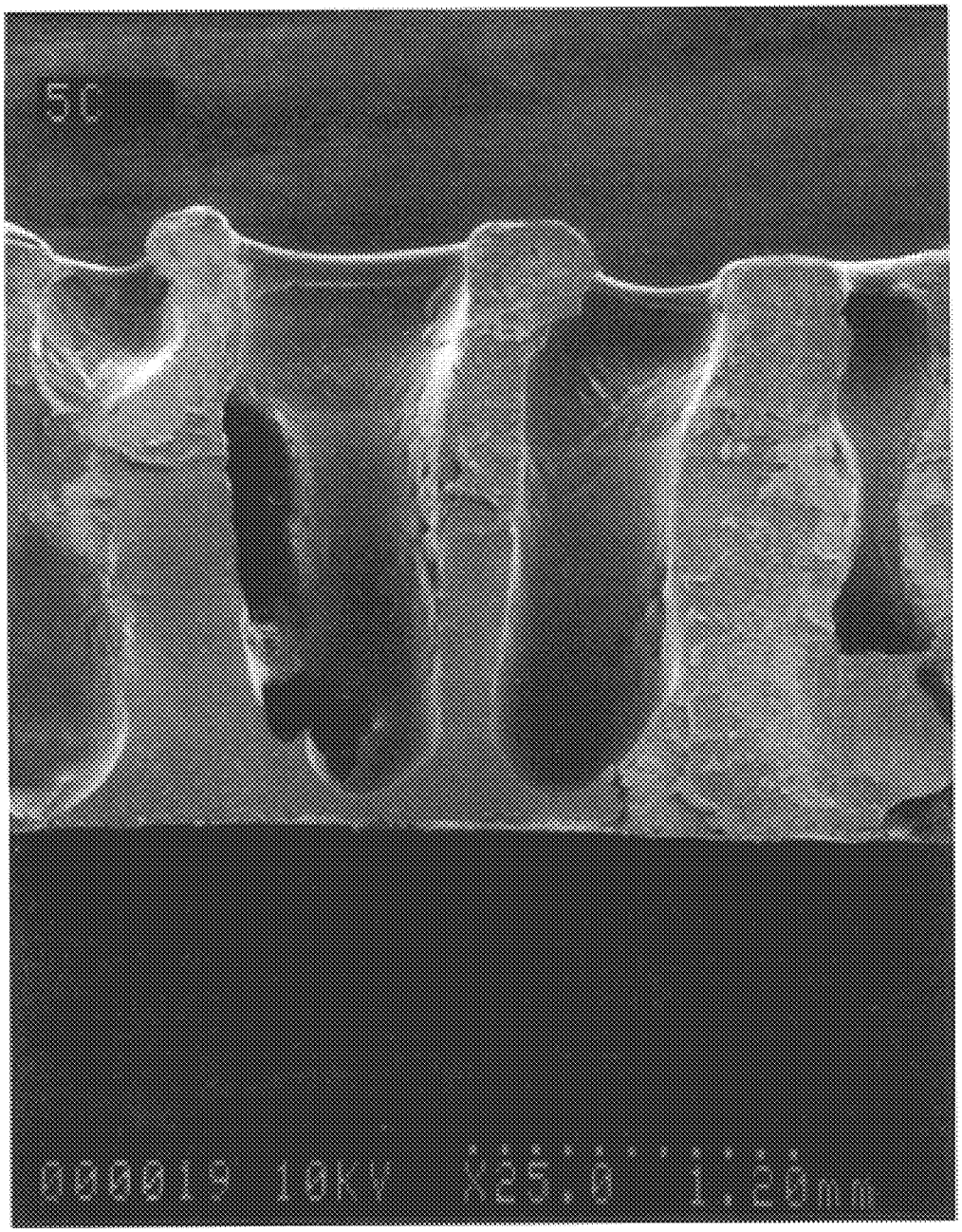
FIG. 4 is a photomicrograph of a cross section of a polishing pad of the present invention.

After a total of 35 minutes the coated substrate was removed from the coating bath. It was dried in an oven at 100° C. for three hours. A coating thickness of 2342$\mu$ (92.2 mils) was achieved. The average pore size was 789$\mu$ (33.7 mils). A photomicrograph of the pad material made by the procedure of this Example 1 is shown as FIG. 4.

EXAMPLE 2

In this Example a material with uniform, long, cylindrical pores was obtained. The same apparatus was used as in Example 1. A coating bath was formulated comprising Witcobond W-506 (manufactured by Witco Corporation), a 40% solids colloidal waterborne polyurethane dispersion, and Ludox AS-40 (manufactured by duPont Company), a colloidal silica stabilized with $NH_4OH$ and water. The ratio of Witcobond W-506 to Ludox AS-40 was 50:50 by solids. One liter of coating bath was mixed directly in the coating bath vessel. One stainless steel electrode was the substrate and was connected to the positive electrode of the power supply. The second stainless steel electrode was connected to the negative electrode of the power supply. The voltage was maintained at 50 Volts. The current was decreased as follows:

| Time (min) | Current (mA) |
|---|---|
| 0 | 210 |
| 3 | 25 |
| 15 | 15 |
| 27 | 13 |
| 34 | 12 |
| 45 | 12 |
| 60 | 12 |

A coating thickness of 2032$\mu$ (80 mils) was attained along with a pore size of roughly 866$\mu$ (34.1 mils).

Nothing from the above discussion is intended to be a limitation of any kind with respect to the present invention. All limitations to the present invention are intended to be found only in the claims, as provided below.

What is claimed is:

1. A method of making a porous polishing pad material for a polishing pad, the method comprising electrophoretic deposition by immersing spaced apart electrodes in a bath, and while mixing the bath, impressing the electrodes with controlled electrical conditions, the method further comprising the steps of:

immersing spaced apart electrodes in a bath having polymeric particles and water;

impressing the electrodes with the controlled electrical conditions that consist of, a controlled voltage difference across the electrodes, and 4 controlled current flow through the electrodes;

depositing the polymeric particles on one of the electrodes to form a polymeric mass while generating gaseous bubbles within the polymeric mass, which bubbles open at an exterior surface of the polymeric mass to provide a porous polishing pad material having pores therein that open at an exterior polishing surface on the polishing pad material; and varying one of the controlled electrical conditions over a time duration as a thickness of the polymeric mass increases to increase the lengths of the bubbles transverse to the thickness of the polymeric mass.

2. The method as recited in claim 1, wherein the step of impressing the electrodes with controlled electrical conditions further includes the step of, connecting the electrodes to a power supply apparatus that supplies the controlled electrical conditions.

3. The method as recited in claim 1, wherein the step of immersing spaced apart electrodes in a bath having polymeric particles and water, further includes the step of immersing the spaced apart electrodes in a bath having abrasive particles; and wherein the step of depositing the polymeric particles on one of the electrodes to form a polymeric mass while generating gaseous bubbles within the polymeric mass, further includes the step of, depositing the polymeric particles on one of the electrodes to form a polymeric mass having abrasive particles within the polymeric mass.

4. The method as recited in claim 1, and further comprising the step of: maintaining another of the controlled electrical conditions constant while varying said one of the controlled electrical conditions to increase the lengths of the bubbles as the thickness of the polymeric mass increases.

5. The method as recited in claim 4, wherein the step of maintaining another of the controlled electrical conditions constant further includes the step of, maintaining the controlled voltage difference across the electrodes constant while decreasing the controlled current flow through the electrodes over a time duration as the thickness of the polymeric mass increases to increase the lengths of the bubbles transverse to the thickness of the polymeric mass.

6. The method as recited in claim 1, wherein the step of varying one of the controlled electrical conditions further includes the step of: decreasing the controlled current flow through the electrodes over a time duration as the thickness of the polymeric mass increases to increase the lengths of the bubbles transverse to the thickness of the polymeric mass.

7. The method as recited in claim 6, wherein the step of impressing the electrodes with controlled electrical conditions further includes the step of, connecting the electrodes to a power supply apparatus that supplies the controlled electrical conditions.

8. The method as recited in claim 6, wherein the step of immersing spaced apart electrodes in a bath having polymeric particles and water, further includes the step of immersing the spaced apart electrodes in a bath having abrasive particles; and wherein the step of depositing the polymeric particles on one of the electrodes to form a polymeric mass while generating gaseous bubbles within the polymeric mass, further includes the step of, depositing the polymeric particles on one of the electrodes to form a polymeric mass having abrasive particles within the polymeric mass.

9. The method as recited in claim 6, and further comprising the step of: maintaining another of the controlled electrical conditions constant while decreasing the controlled current flow through the electrodes over a time duration as the thickness of the polymeric mass increases to increase the lengths of the bubbles transverse to the thickness of the polymeric mass.

10. The method as recited in claim 7, wherein the step of maintaining another of the controlled electrical conditions constant further includes the step of, maintaining the controlled voltage difference across the electrodes constant.

11. The method as recited in claim 1, wherein the step of varying one of the controlled electrical conditions further includes the step of, increasing the controlled voltage difference across the electrodes over a time duration as the thickness of the polymeric mass increases to increase the lengths of the bubbles transverse to the thickness of the polymeric mass.

12. The method as recited in claim 11, wherein the step of impressing the electrodes with controlled electrical conditions further includes the step of, connecting the electrodes to a power supply apparatus that supplies the controlled electrical conditions.

13. The method as recited in claim 11, wherein the step of immersing spaced apart electrodes in a bath having polymeric particles and water, further includes the step of immersing the spaced apart electrodes in a bath having abrasive particles; and wherein the step of depositing the polymeric particles on one of the electrodes to form a polymeric mass while generating gaseous bubbles within the polymeric mass, further includes the step of, depositing the polymeric particles on one of the electrodes to form a polymeric mass having abrasive particles within the polymeric mass.

14. The method as recited in claim 11, and further comprising the step of: maintaining another of the controlled electrical conditions constant while increasing the controlled voltage difference across the electrodes over a time duration as the thickness of the polymeric mass increases to increase the lengths of the bubbles transverse to the thickness of the polymeric mass.

15. The method as recited in claim 14, wherein the step of maintaining another of the controlled electrical conditions constant, further includes the step of, maintaining the controlled current flow through the electrodes constant while increasing the controlled voltage across the electrodes over a time duration as the thickness of the polymeric mass increases to increase the lengths of the bubbles transverse to the thickness of the polymeric mass.

* * * * *